United States Patent
Monsma et al.

(10) Patent No.: US 6,331,944 B1
(45) Date of Patent: Dec. 18, 2001

(54) MAGNETIC RANDOM ACCESS MEMORY USING A SERIES TUNNEL ELEMENT SELECT MECHANISM

(75) Inventors: Douwe Johannes Monsma, Palo Alto; Stuart Stephen Papworth Parkin, San Jose; Roy Edwin Scheuerlein, Cupertino, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/549,172

(22) Filed: Apr. 13, 2000

(51) Int. Cl.[7] .................................................. G11C 13/00
(52) U.S. Cl. ................... 365/171; 365/173; 365/232; 365/158; 365/32; 365/33
(58) Field of Search .................... 365/171, 173, 365/32, 33, 8, 158, 232

(56) References Cited

U.S. PATENT DOCUMENTS

| | | | |
|---|---|---|---|
| 4,791,604 | * 12/1988 | Lienau et al. | 365/9 |
| 5,541,868 | 7/1996 | Prinz . | |
| 5,640,343 | * 6/1997 | Gallagher | 365/171 |
| 5,695,864 | 12/1997 | Slonczewski . | |
| 5,734,605 | 3/1998 | Zhu et al. . | |
| 6,069,820 | * 5/2000 | Inomata et al. | 365/171 |
| 6,072,382 | * 6/2000 | Daughton et al. | 338/32 |
| 6,130,835 | * 10/2000 | Scheuerlein | 365/171 |

* cited by examiner

*Primary Examiner*—Viet Q. Nguyen
(74) *Attorney, Agent, or Firm*—Thomas R. Berthold, Esq.; Banner & Witcoff, Ltd.

(57) ABSTRACT

A non-volatile memory array includes first and second pluralities of electrically conductive traces formed on a substrate. The second plurality of electrically conductive traces overlap first plurality of traces at a plurality of intersection regions. Each of a plurality of memory cells is located at an intersection region between one of the first plurality of traces and one of the second plurality of traces. At least one of the memory cells includes a non-linear selection element in series with a magnetic tunnel junction storage element. The non-linear selection element includes at least a first metallic electrode layer, a barrier layer and a second metallic electrode layer metal. The non-linear selection element has a non-linearity defined by a current having a first magnitude flowing through the non-linear selection element for a first bias voltage across the non-linear selection element that is ten times or more smaller than a current having a second magnitude flowing through the non-linear selection element for a second bias voltage across the non-linear selection element, such that the second bias voltage is about two times greater than the first bias voltage. The magnetic tunnel junction storage element includes at least a first ferromagnetic layer, a thin insulating layer and a second ferromagnetic layer.

22 Claims, 7 Drawing Sheets

MAGNETIC RANDOM ACCESS MEMORY USING A SERIES TUNNEL ELEMENT SELECT MECHANISM

CROSS REFERENCE TO RELATED APPLICATIONS

The present application is related to U.S. patent application Ser. No. 09/549,171, entitled "Magnetic Random Access Memory Using Current Through MTJ Write Mechanism," invented by D. J. Monsma et al., and U.S. patent application Ser. No. 09/549,211, entitled "Magnetic Random Access Memory Using A Non-Linear Memory Element Selection Mechanism," invented by D. J. Monsma et al., both of which were filed concurrently with the present application, and each of which is incorporated by reference herein.

BACKGROUND OF THE INVENTION

1. Field of the Invention

The present invention relates generally to the field of nonvolatile memory devices for use in computers and other devices. More particularly, the present invention relates to nonvolatile memory arrays that use magnetic memory elements as individual memory cells.

2. Description of the Related Art

Certain types of magnetic memory cells that use the magnetic state of a ferromagnetic region for altering the electrical resistance of materials located near the ferromagnetic region are collectively known as magnetoresistive (MR) memory cells. An array of magnetic memory cells is often called a magnetic random access memory (MRAM).

In comparison to metallic MR memory cells, which are based on giant magnetoresistance (GMR) or anisotropic magnetoresistance (AMR) devices, MRAM memory cells are based on magnetic tunnel junction (MTJ) devices and rely on substantially different physical principles. For example, GMR devices include at least two ferromagnetic layers that are separated by a thin metallic layer. In contrast, an MTJ device has two ferromagnetic layers that are separated by a thin insulating tunnel barrier. The magnetoresistance of an MTJ device results from a spin-polarized tunneling of conduction electrons between the two ferromagnetic layers that depends on the relative orientation of the magnetic moments of the two ferromagnetic layers. Another important distinction between GMR and MTJ devices is that current flows parallel to the thin film layers forming a GMR device, whereas current flows perpendicularly to the thin film layers forming an MTJ device.

Figure 1A:
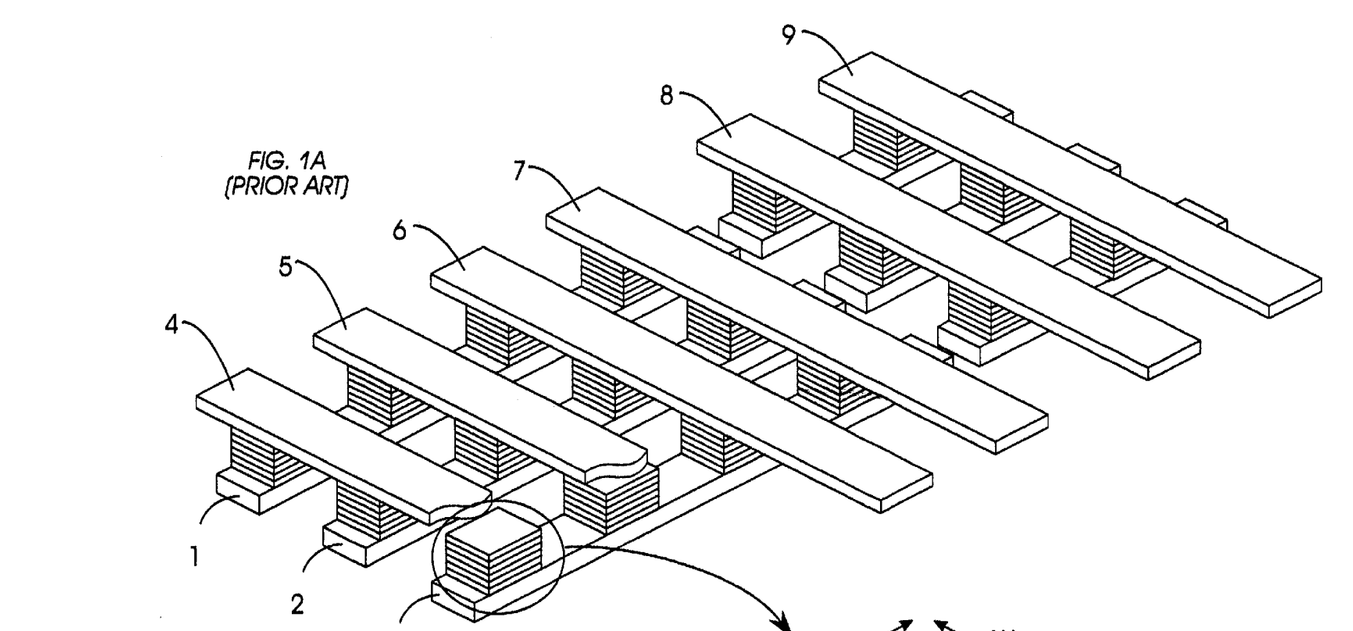
FIG. 1A shows a conventional MRAM array having magnetoresistive memory cells that are located between bit and word lines.

FIG. 1A shows a portion of a conventional MRAM array that uses conventional magnetoresistive memory cells, such as disclosed by U.S. Pat. No. 5,640,343 to Gallagher et al. (the Gallagher '343 patent). The MRAM array shown in FIG. 1A includes a set of electrically conductive traces 1–3 in a horizontal plane that function as parallel word lines and a set of electrically conductive traces 4–8 in another horizontal plane that function as parallel bit lines. The word lines are oriented in a different direction from the bit lines, preferably at a right angle, so that the two sets of lines intersect when viewed from above. The MRAM array of FIG. 1A is referred to as a cross point array because memory cells are placed at the intersection point of crossing lines. The MRAM array of FIG. 1A is formed on a substrate (not shown), such as a silicon, on which there would be other circuitry (also not shown). For clarity, a layer of insulative material that is located between the bit lines and word lines within the MRAM other than the intersecting regions is not shown. While three word lines and six bit lines are illustrated in FIG. 1A, the total number of lines is typically much larger.

Figure 1B:
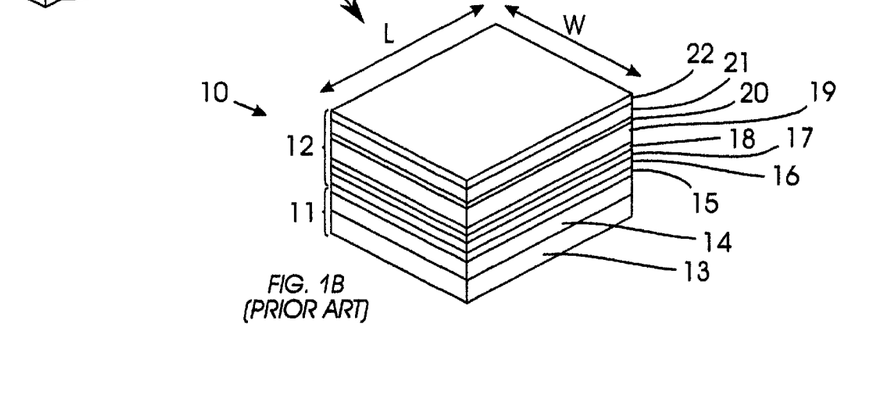
FIG. 1B shows an enlarged view of a conventional magnetoresistive memory cells of the conventional MRAM shown in FIG. 1A.

A conventional memory cell 10 is located at each crossing point of the word lines and bit lines within an intersection region that is vertically spaced between the respective sets of lines. FIG. 1B shows an enlarged view of a conventional magnetoresistive memory cell 10. Memory cell 10 includes a vertical stack of a diode-like selection device 11, e.g., a silicon junction diode, connected electronically in series with a magnetic tunnel junction (MTJ) device 12. Memory cell 10 can be fabricated very densely because the cell has only two terminals and has a vertical current path through selection device 11 and MTJ 12.

Selection device 11 is a silicon junction diode that is formed from an n-type silicon layer 13 and a p-type silicon layer 14. The n-type silicon layer 13 is formed on and connected to word line 3. The p-type silicon layer 14 is connected to the MTJ 12 via a tungsten stud 15. MTJ 12 is formed from a series of layers of material that are stacked one on top of the other. MTJ 12 includes a template layer 16, such as Pt, an initial ferromagnetic layer 17, such as permalloy (Ni—Fe), an antiferromagnetic layer (AF) 18, such as Mn—Fe, a fixed ferromagnetic layer (FMF) 19, such as Co—Fe or permalloy, a thin tunneling barrier layer 20 of alumina (Al2O3), a soft ferromagnetic layer (FMS) 21, such as a sandwich of thin Co—Fe with permalloy, and a contact layer 22, such as Pt. Additional details regarding conventional memory cell 10 are provided in U.S. Pat. No. 5,640,343 to Gallagher et al., which is incorporated by reference herein.

Diode 11 is necessary for preventing currents from flowing through alternate current paths, referred to herein as sneak currents. For instance, if in FIG. 1A, word line 2 is grounded and a bias of $V_A$ is applied to bit line 7, a signal current will flow through the selected cell (in this case the cell connecting word line 2 and bit line 7, referred to herein as cell 2,7). A very small current will flow through alternate paths, for example, via cells 2,6, 3,6 and 3,7 because the diode in cell 3,6 is reverse biased. The reverse currents for all of the unselected diodes in the memory matrix contribute to the total sneak current. In order to maintain the signal current to be of the same order of magnitude as the total sneak current for an n×n matrix, the rectification ratio of the selected diode must be greater than $n^2$. Such a requirement for a diode requires a device-quality semiconducting diode material, which cannot easily be grown on top of a metallic word line, and implies that the diode will have a high resistance.

Additionally, the resistance of the diode, and more particularly the differential resistance of the diode, should be less than the resistance of the MTJ device so that sensing circuitry can easily detect changes in resistance of the MTJ device that represent the different states of the MTJ device. Thus, a large diode resistance implies a correspondingly large MTJ resistance so that MTJ device resistance changes can be easily detected. A high overall diode and MTJ resistance results in slow performance caused by RC delays, in addition to limited power levels during a sensing operation. A drawback associated with the Gallagher '343 memory cell is the high resistance of the diode between the two metal layers.

U.S. Pat. No. 5,734,605 to Zhu et al. discloses an alternative conventional MRAM cell that uses a transistor as a selection element for a memory cell. The Zhu et al. MRAM cell uses more space than a cross point cell because the cell has more than two terminals. Moreover, the cell must have a connection from the MTJ to the silicon surface where the transistor is located. The transistor also occupies more area than the tunnel junction occupies.

Another alternative conventional memory cell is described in U.S. Pat. No. 5,991,193 to Gallagher et al. (the Gallagher '193 patent). The memory cell disclosed in the Gallagher '193 patent uses a two-terminal, non-linear resistance semiconductor switch, such as a camel diode or backward diode containing highly doped semiconductor material. Such non-linear resistance devices can have lower resistance than a conventional diode. A cross point MRAM array formed from a vertical series connection of non-linear resistance selection device and MTJs, however, requires that the non-linear resistance devices be grown on top of a metal word lines. Growth of device-quality semiconductor material on top of a metal is exceedingly difficult and generally results in an amorphous or polycrystalline semiconductor. Accordingly, concomitant drawbacks include difficulties in achieving high active-doping densities for such non-linear resistance semiconductor switches, very high contact and series resistances, and devices having generally poor characteristics.

What is needed is a MRAM cell having only two terminals, uses a low resistance non-linear selection device, and has a vertical current path so that the selection device structure is easily fabricated on top of a metal line.

SUMMARY OF THE INVENTION

The present invention provides a MRAM cell having only two terminals, uses a low resistance non-linear selection device, and has a vertical current path so that the selection device structure is easily fabricated on top of a metal line.

The advantages of the present invention are provided by a non-volatile memory cell having a non-linear selection element and a magnetic tunnel junction storage element. The non-linear selection element includes at least a first metallic electrode layer, a barrier layer and a second metallic electrode layer metal, wherein the barrier layer can be formed from an insulating layer or a semi-conducting layer. According to the invention, the non-linear selection element has a non-linearity defined by a current having a first magnitude flowing through the non-linear tunnel selection element for a bias $V_R$ across the non-linear selection element for reading the magnetic tunnel junction storage element, such that $V_R$ is about 0.5 V and is ten times or more smaller than a current having a second magnitude flowing through the non-linear tunnel selection element for a bias $V_W$ across the non-linear selection element for writing the magnetic tunnel junction storage element, where $V_W$ is about 1.0 V. The barrier layer of the non-linear tunnel selection device, in combination with the metallic electrode layers, has a barrier height of less than about 1 eV. Preferably, the barrier layer is about 3 nm thick, and has a barrier height of about 0.5 eV. The magnetic tunnel junction storage element includes at least a first ferromagnetic layer, a thin insulating layer and a second ferromagnetic layer. According to one aspect of the present invention, one of the ferromagnetic layers of the magnetic tunnel junction storage element and one of the metallic electrode layers of the non-linear selection element are common to both the ferromagnetic layer and the metallic electrode layer.

The present invention also provides a non-volatile memory array that includes first and second pluralities of electrically conductive traces formed on a substrate. The second plurality of electrically conductive traces overlap first plurality of traces at a plurality of intersection regions. Each of a plurality of memory cells is located at an intersection region between one of the first plurality of traces and one of the second plurality of traces. According to the invention, at least one of the memory cells includes a non-linear selection element in series with a magnetic tunnel junction storage element. The non-linear selection element has a non-linearity defined by a current having a first magnitude flowing through the non-linear tunnel selection element for a bias $V_R$ across the non-linear selection element for reading the magnetic tunnel junction storage element, such that $V_R$ is about 0.5 V that is ten times or more smaller than a second current flowing through the non-linear selection element for a bias $V_W$ across the non-linear selection element for writing the magnetic tunnel junction storage element, where $V_W$ is about 1.0 V.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides an MRAM memory cell formed from a magnetoresistive element (MRE), such as an MTJ, connected in series with a metal-barrier-metal (MBM) junction selection device, such as a metal-insulator-metal (MM) or a metal-insulator-metal (MSM) junction. The abbreviation MBM is used herein to mean metal-barrier-metal, where the barrier material B may be an insulator or semiconductor. Preferably, the barrier layer B of the MBM junction selection device is formed to have a thickness of about 3 nm and a barrier height with the metallic electrodes of about 0.5 eV, thereby producing a non-linearity of $I(0.5V_A)<0.1I(1V_A)$ where $V_A$ is about 1 Volt. The transport mode in which an MBM operates is different from the transport mode of a common diode. In a diode, transport is governed by electron transmission through an ohmic contact, followed by ohmic transport in the semiconductor, thermionic transport through a depletion region and transmission through the p-n junction or metal-semiconductor Schottky barrier. In an MBM, the thickness of the insulating or semiconducting layer B is thin enough for allowing predominant direct tunneling (in contrast to thermionic transport), yet thick and low enough for providing a strong non-linear current-voltage characteristic. For specific parameters, the non-linearity can be sufficient for guaranteeing good selection or, in other words, a low total sneak current in an n×n MRAM matrix, for n on the order of 100. Because an MBM can be designed to have symmetric I-V characteristics, an MBM can be used effectively in a MRAM design in which the write current flows through the MTJ. Moreover, the MBM selection device of the present invention combines non-linear characteristics with a low series resistance without using crystalline materials and, consequently, can be grown directly on top of a metal word line.

Another advantage provided by an MM-type selection device is a device resistance having a lower temperature sensitivity in comparison to the device resistance of a diode. An MIM device is based on tunneling, which is known to be very temperature insensitive. In contrast, a diode is a thermionic field emission device having a large temperature dependence and should be avoided in order to provide an MRAM memory having the widest possible operating range.

The MBM-MRE memory cell of the present invention is stacked vertically for maximizing areal density. An n×n cross point array is formed using n word lines oriented perpendicularly to n bit lines, and with a memory cell connecting each cross point. Applying a read bias voltage $V_A$ between a selected word line and a selected bit line results in a voltage drop of $V_A$ across the cell at the intersection of the selected word and bit lines, and a voltage drop of approximately 0.5 $V_A$ across unselected cells. Hence, the voltage drop across the MBM of the selected cell is $V_{mbm}=V_A-V_{mtj}$, and the voltage drop across an MBM of an unselected cell is $V_{mbm}=0.5(V_A-V_{mtj})$. The non-linearity of the MBM selection device makes the resistance of the MBM selection device many times larger at approximately half bias than at full bias, resulting in relatively small sneak currents through unselected cells. Consequently, the output current is largely proportional to the state of the selected cell. For an n×n matrix having $n^2$ cells, the signal current will be nearly equal to the total sneak current when the current at half bias is 1/n times the current at full bias, thereby specifying the requirements of the I-V characteristics of the MBM junction.

Figures 2A, 2B:
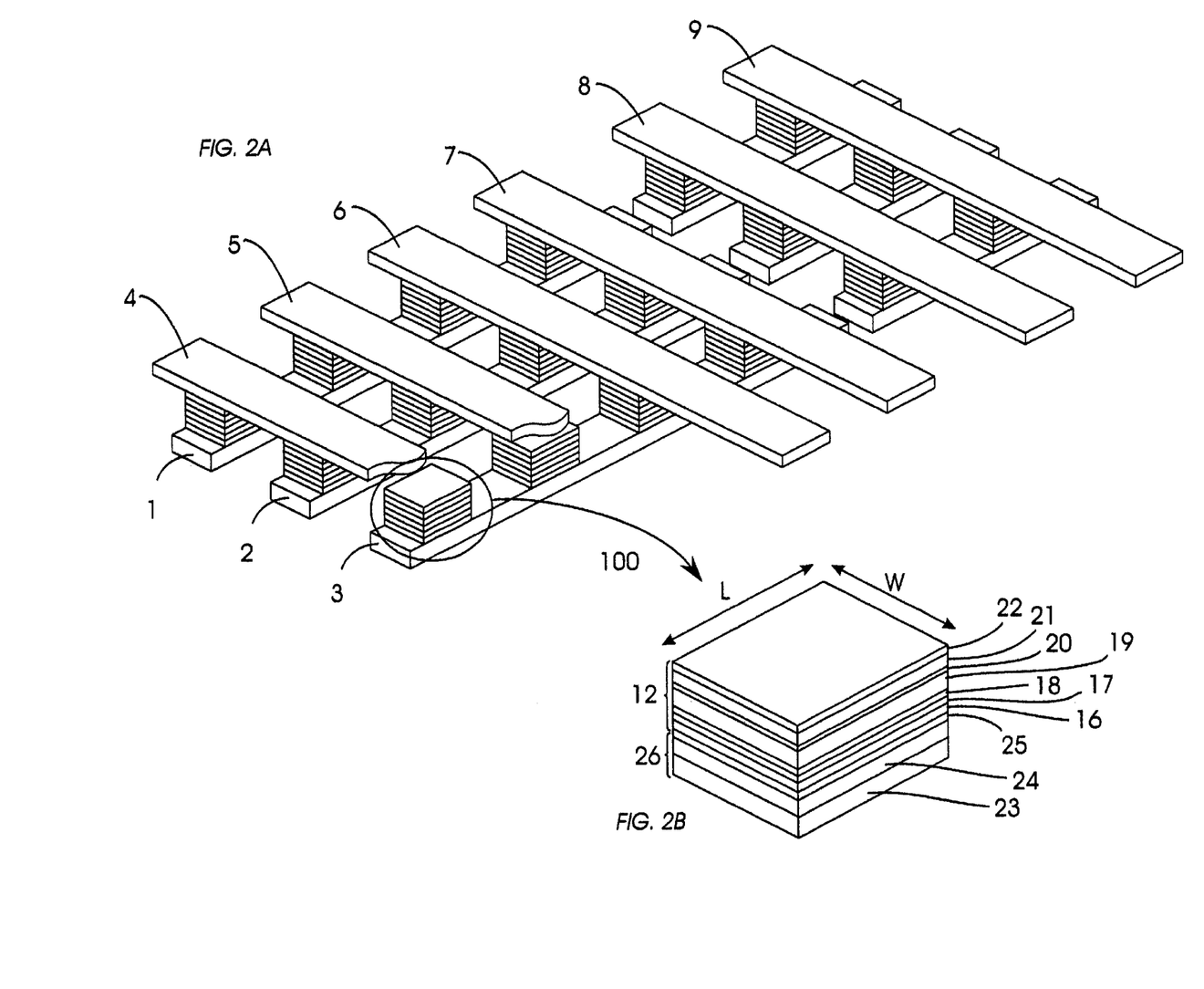
FIG. 2A shows an MRAM array having magnetoresistive memory cells according to the present invention.
FIG. 2B shows an enlarged view of a preferred embodiment of a magnetoresistive memory cell according to the present invention.

FIG. 2A shows an MRAM array having magnetoresistive memory cells according to the present invention. FIG. 2B shows an enlarged view of a preferred embodiment of a magnetoresistive memory cell 100 according to the present invention. Memory cell 100 includes an MBM selection device 26 and an MTJ 12. MBM selection device 26 is preferably a non-magnetic non-linear element (NLE), such as a metal-insulator-metal (MIM) or metal-semiconductor-metal junction (MSM), that is formed in a well-known manner from a lower metal electrode 23, a barrier layer 24 and an upper electrode 25. Lower metal electrode 23, such as Pt, is grown on top of word line 3. Barrier layer 24 is made of, for example, an amorphous semiconductor such as H:Si or an oxidic semiconductor such as $TiO_2$, and is grown on top of layer 23. Other materials that barrier layer 24 can be formed from include aluminum arsenide, silicon, germanium, boron-nitride, strontium titanate, diamond-like carbon, tin oxide, and zinc oxide. Upper electrode 25 made of, for example, Pt, and is grown on top of barrier 23. The thickness of barrier layer 24 is about 25 Å. The barrier height formed by the MBM junction is about 0.4 eV.

MTJ 12 is formed from stacks 16≧22. MTJ 12 includes a template layer 16, such as Pt, an initial ferromagnetic layer 17, such as permalloy (Ni—Fe), an antiferromagnetic layer (AF) 18, such as Mn—Fe, a fixed ferromagnetic layer (FMF) 19, such as Co—Fe or permalloy, a thin tunneling barrier layer 20 of alumina ($Al_2O_3$), a soft ferromagnetic layer (FMS) 21, such as a sandwich of thin Co—Fe with permalloy, and a contact layer 22, such as Pt. Preferably, MTJ 12 is a conventional MTJ, such as disclosed by U.S. Pat. No. 5,640,343 to Gallagher et al., which is incorporated by reference herein. MTJ 12 can have nearly linear electrical characteristics. Alternatively, MTJ 12 can have non-linear electrical characteristics. Additionally, upper electrode layer 25 of MBM 26 and template layer 16 of MTJ 12 can be fabricated so that they are common to both MBM 25 and MTJ 12.

Figure 3A:
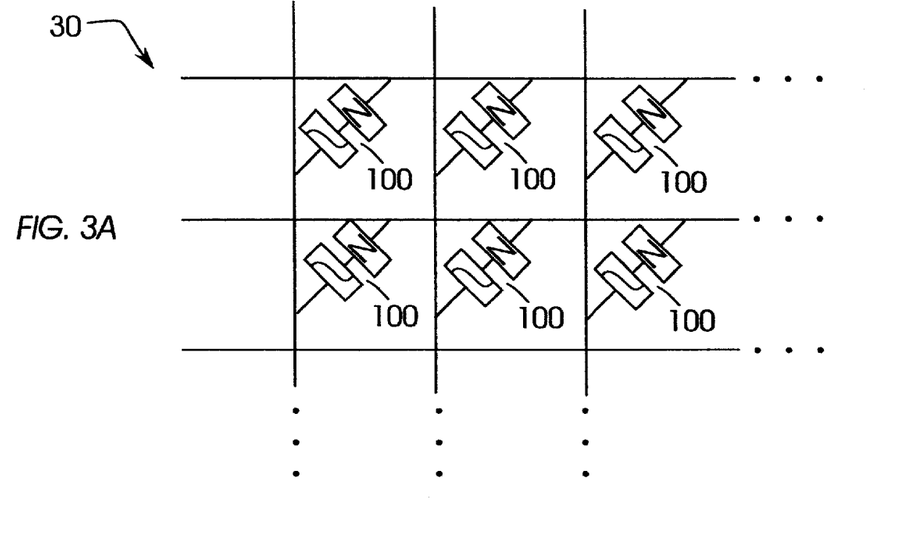
FIG. 3A is a schematic block diagram of an MRAM array having a series MBM-MTJ combination in each storage cell according to the present invention.
Figure 3B:
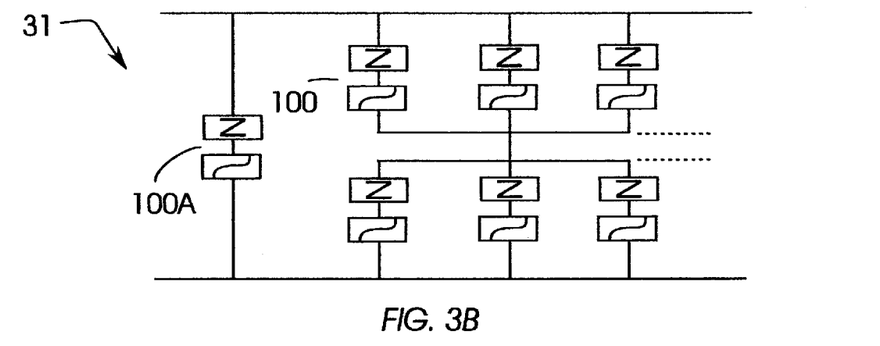
FIG. 3B is a schematic block diagram of an electrical equivalent circuit of the MRAM array of FIG. 3A.
Figure 3C:
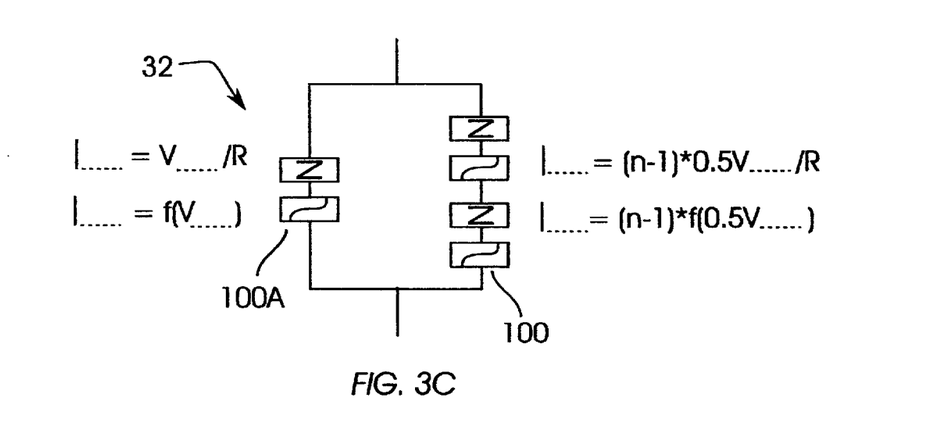
FIG. 3C is a further simplified schematic block diagram of an electrical equivalent circuit of the equivalent circuit of FIG. 3B.

FIG. 3A is a schematic block diagram of an MRAM array 30 having a series MBM-MTJ combination forming each storage cell, such as shown in FIG. 2B. Word lines 1–3 are oriented perpendicularly to bit lines 4–6. A memory cell 100 is located at the intersection of the word and bit lines. FIG. 3B is a schematic block diagram of an electrical equivalent circuit 31 for MRAM array 30. Memory cell 100A represents a selected cell, while the rest of the memory cells are unselected. FIG. 3C is a further simplified schematic block diagram of an electrical equivalent circuit 32 for equivalent circuit 31 of FIG. 3B for determining signal current and total sneak current.

FIG. 3B is a simplification of FIG. 3A. In the situation when cell 1,4 is selected using word line 4 and bit line 1, parallel sneak paths are formed through all cells that are directly connected to word line 4 and bit line 1. For a large n×n array, the cells that are not directly connected to word line 4 and bit line 1 can be considered to be a short. FIG. 3B results from such an analysis. The upper horizontal line in FIG. 3B represents word line 4, and the lower horizontal line represents bit line 1. The equivalent circuit of FIG. 3B is shown in FIG. 3C, where the n parallel sneak paths are represented by an equivalent MBM-MTJ cell having an I-V function $I_{sneak}=(n-1)*f(0.5V_A)$, such that $f(0.5V_A)$ is the non-linear function of the MBM at half of the total applied bias voltage. The signal current through the selected MTJ is $I_{signal}=V_A/R_{MTJ}$. In order to achieve $I_{sneak}<I_{signal}$, the following inequality must hold: $(n-1)*f(0.5V_A)<f(V_A-V_{MTJ})$, where $V_{MTJ}$ is approximately 0.2 Volts. Hence, the current through a useful MBM at half bias must be approximately n time smaller at half bias than at full bias.

Figure 4A:
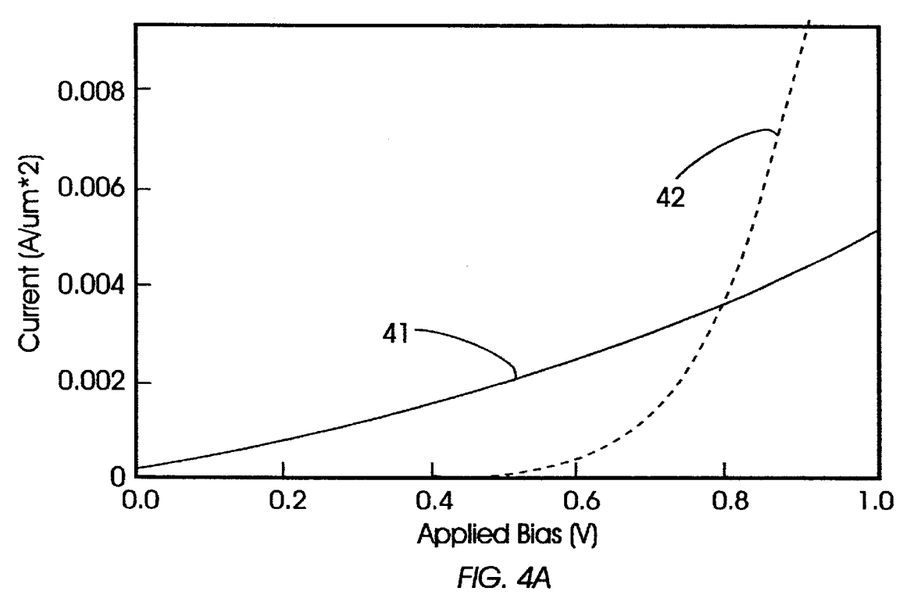
FIG. 4A is a graph showing a lin-lin representation of calculated current-voltage (I-V) characteristics for an MTJ having a barrier height of 1.7 eV and a thickness of 7 Å and for a non-magnetic tunnel junction (TJ) having a barrier height of 0.4 eV and a thickness of 25 Å.
Figure 4B:
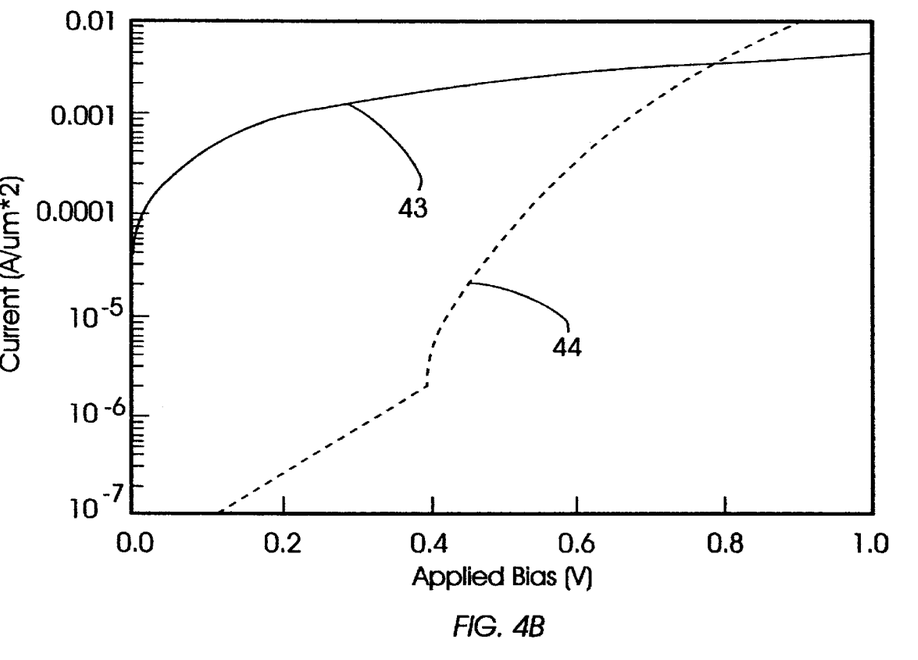
FIG. 4B is a graph showing a log-lin representation of the graph of FIG. 4A.

FIG. 4A is a graph showing a lin-lin representation of calculated current-voltage (I-V) characteristic for an MTJ having a barrier height of 1.7 eV and a thickness of 7 Å and for a non-magnetic tunnel junction (TJ) having a barrier height of 0.4 eV and a thickness of 25 Å. In FIG. 4A, the I-V characteristic for the MTJ is shown by curve 41, and the I-V characteristic for the TJ is shown by curve 42. FIG. 4B is a graph showing a log-lin representation of the graph of FIG. 4A. In FIG. 4B, the I-V characteristic for the MTJ is shown by curve 43, and the I-V characteristic for the TJ is shown by curve 44. For maximum magnetoresistance output signal, the desired bias across the selected MTJ is 0.2 V. The resulting current is 0.8 mA. For an MTJ having a linear electrical characteristic, the resistance of the MTJ is 250 Ω (1 $\mu m^2$). Because the MTJ and the MBM are in series, the current through the selected NLE is the same. The resulting bias across the MBM can be found from the dashed curves in FIGS. 4A and 4B. At 0.8 mA, the MBM has a voltage drop of 0.66 V. Thus, the total applied voltage $V_A$ should be 0.86 V.

Based on the total applied voltage $V_A$, the current through one sneak path can now be calculated. The total bias $V_A$ is 0.86 V across two unselected MBM-MT series combinations. Hence, the voltage drop across one MBM-MTJ combination is 0.43 V. The individual voltage drops can be deduced graphically from FIGS. 4A and 4B, by taking equal currents through both the MBM and the MTJ, or calculated when the I-V functions are known. From FIGS. 4A and 4B, the voltage drop across the MTJ is about 2.5 mV, and the current about 10 $\mu A$. The voltage drop across the MBM is 0.43 V–02.5 mV≈0.43 V. Hence, for this combination of MBM and MTJ, the total voltage drops appears essentially across the MBM. The total sneak current is (n−1) times the sneak current for a single MBM-MTJ combination. Thus, for n=100, the total sneak current is 1 mA, which is approximately equal to the signal current (0.8 mA).

In general, the signal current is approximately equal to the total sneak current when $I(V_A)=(n-1)*I(0.5V_A)$, where $I(V_A)$ is the current at bias $V_A$ for the MBM, $V_A=V_{mtj,s}+V_{mbm,s}$ is the total applied bias, $V_{mtj,s}$ the voltage drop across the selected MTJ, and $V_{mbm,s}$ is the voltage drop across the selected MBM. Note that $V_{mbm,u}$ is the unselected or sneak MBM. For example, when $V_A=1$ V and $V_{mtj,s}=0.2$ V, $V_{mbm,s}=0.8$ V and $V_{mbm,u}=0.5$ V.

For the detection of the bit state of the MTJ device, the resistance of the MTJ varies around the nominal resistance R of the MR by about +30%. For a series connection of the MTJ and an MBM, the dV/dI or differential resistance (inverse slope) of the I-V curve at current I (through both the MBM and the MTJ) must be smaller for the MTJ than for the MBM. As can be seen in FIG. 4A, for the MTJ, the inverse slope at I=0.8 mA is about 250 Ω. The slope of the MBM at I=0.8 mA is 93 Ω, which is about three times greater.

Figure 5:
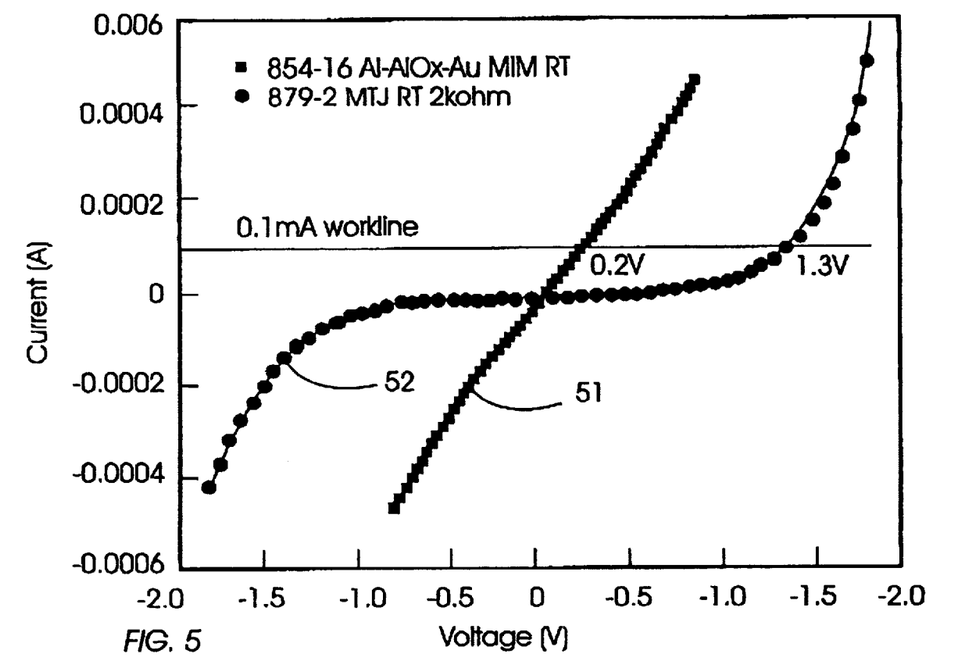
FIG. 5 is a graph showing experimentally-obtained I-V characteristics of a non-linear tunnel junction and a quasi-linear MTJ having an area of 30×30 $\mu m^2$.

From the above calculations, it should be clear that for particular MBM-MTJ combinations, both the selection requirements for n×n matrices can be met (for n>100), as well as the magnetoresistance of the MTJ device maintained FIG. 5 shows experimentally obtained I-V characteristics for a non-magnetic MIM and an MTJ memory cell having an area of 30×30 $\mu m^2$. The experimental MIM used consisted of Al—$Al_2O_3$—Au. The I-V characteristic for the experimental MTJ, shown at 51, is nearly linear and the resistance is about 2 kΩ. The current at 0.2 V is 0.1 mA. The I-V characteristic for the MIM, shown at 52, is non-linear and the voltage drop at 0.1 mA is about 1.3 V. At half total bias (1.3 V+0.2 V)/2=0.75 V, the current through the MIM is about 10 $\mu A$, a factor of 10 smaller than at full bias, which shows that indeed a lower barrier height material is necessary for providing sufficient non-linearity (ratio>100).

Figure 6:
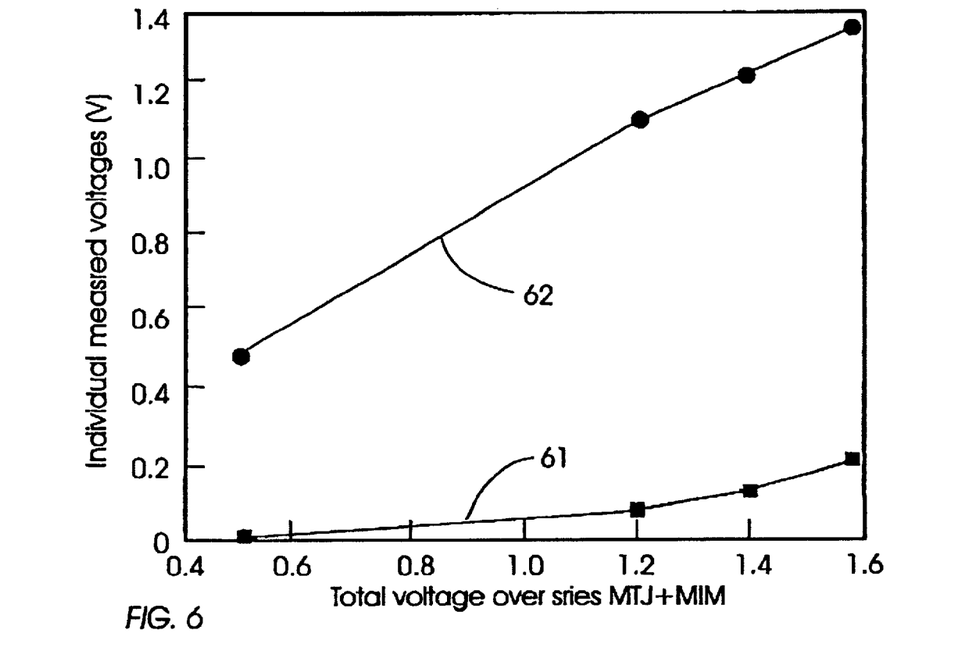
FIG. 6 is a graph showing experimentally-obtained voltage drops across each element of the MIM-MTJ memory cell of FIG. 5 as a function of total applied bias voltage.

FIG. 6 is a graph showing the individual voltage drops across each element of the MIM-MTJ memory cell of FIG. 5 as a function of total applied bias. In FIG. 6, curve 61 shows the voltage drop across the MTJ and curve 62 shows the voltage drop across the MIM. FIG. 6 shows that at lower biases the voltage drop across the MTJ goes to zero, and the total resistance of the pair is basically determined by the MIM alone, which is desired for application in an MRAM matrix.

Figure 7:
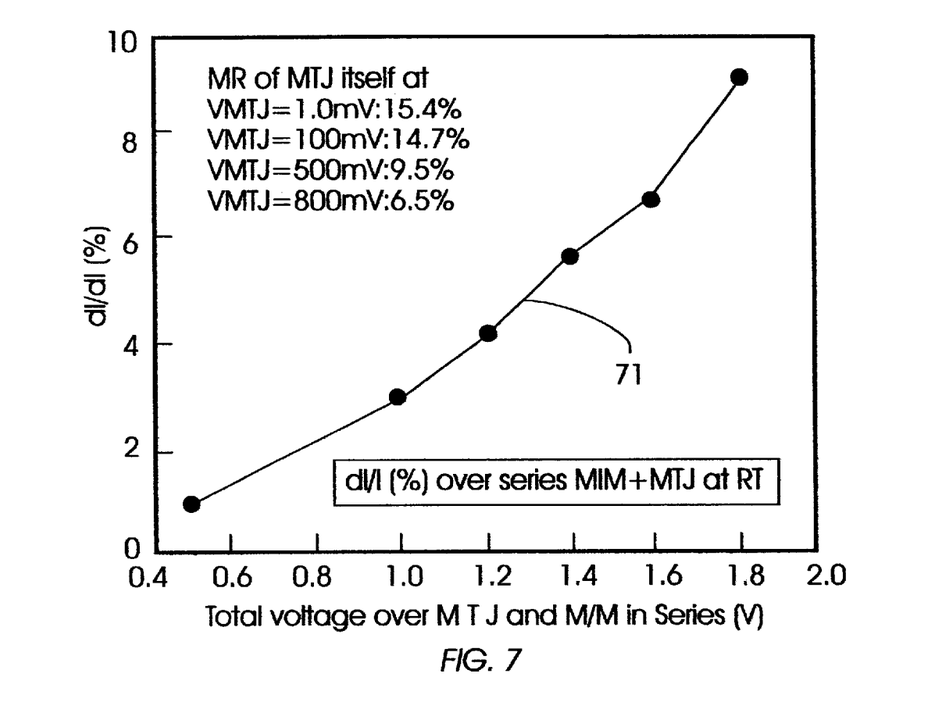
FIG. 7 is a graph showing the maximum relative current variation of an MIM and MTJ connected in series as a function of total applied bias voltage across the MIM and MTJ devices.
Figure 8:
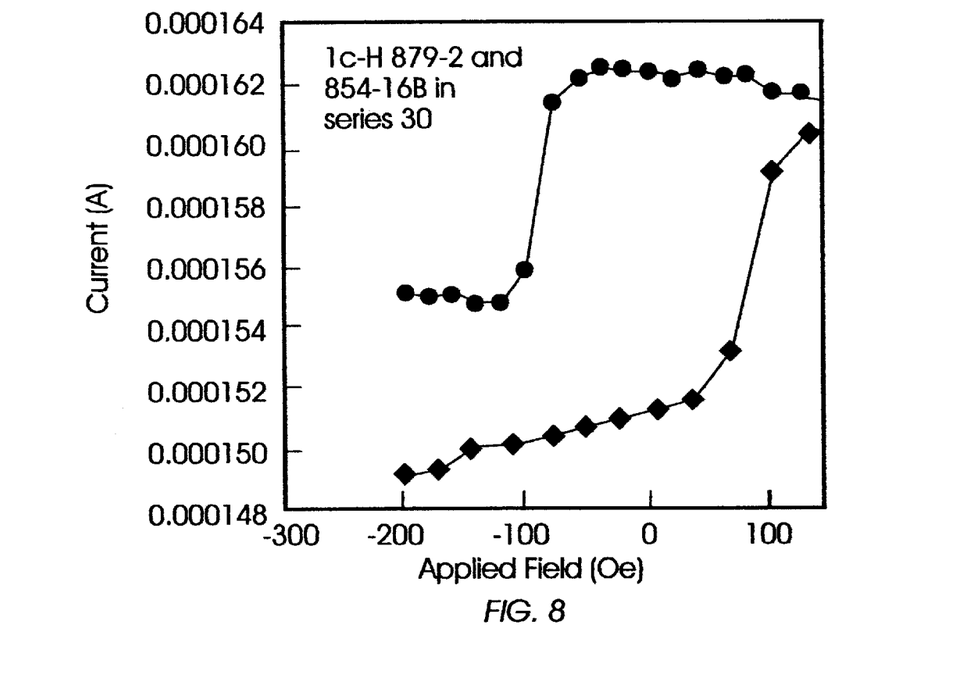
FIG. 8 is a graph showing the current through an MTJ and MIM connected in series as a function of applied magnetic field.

The differential resistance of the MIM at 1.3 V is approximately equal to the resistance of the MTJ, hence, a 50% reduction of the total magnetoresistance of the MTJ alone was expected. The magnetoresistance of the MTJ alone was about 15.4% at room temperature. FIG. 7 shows the maximum relative current change at 71 as a function of total applied voltage across the MTJ and MBM in series and illustrates the effect of increased series resistance of the non-magnetic tunnel junction at lower bias. FIG. 8 is a graph showing the current versus applied field. The drift is a consequence of the large dissipation in this (too high barrier) NLE. FIG. 8 shows that at 1.8 V total bias (about 1.5 V across the MIM and about 0.3 V across the MTJ), the variation in current with field dropped to 8.7% for the MTJ, but is still clearly observable.

Figure 9A:
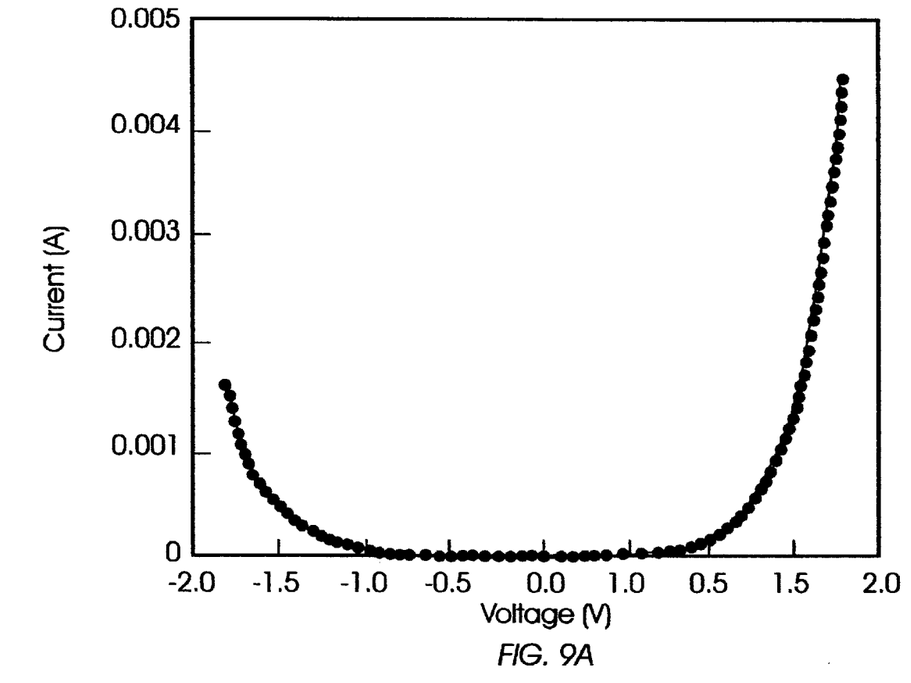
FIG. 9A is a graph showing a lin-lin representation of I-V characteristics for an exemplary non-linear tunnel junction.
Figure 9B:
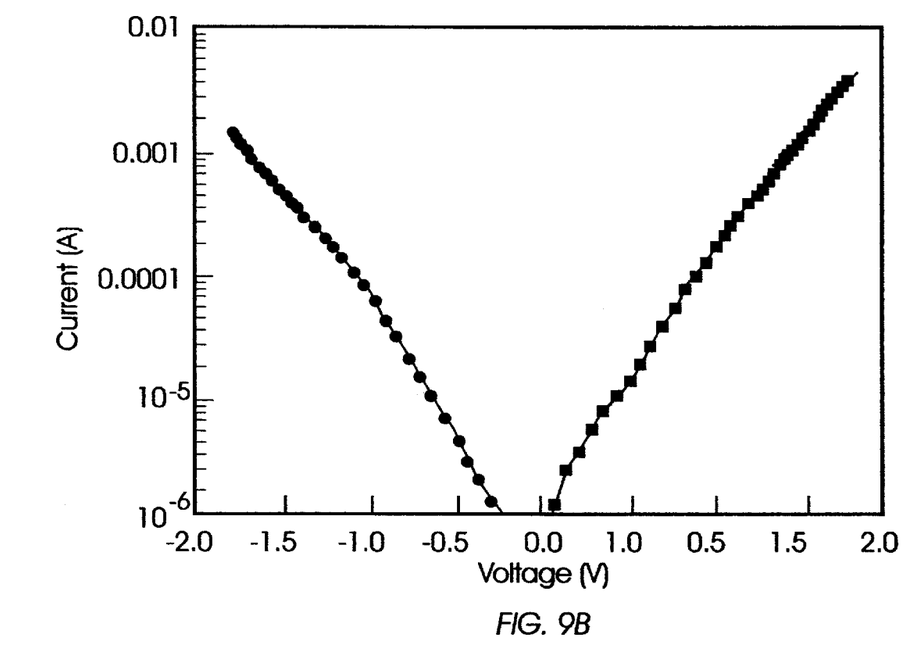
FIG. 9B is a graph showing a log-lin representation of the I-V characteristics for the exemplary tunnel junction of FIG. 9A.

A lin-lin representation of I-V characteristics for an experimental MBM junction formed from a partly $TiO_2$ and partly $Al_2O_3$ barrier is shown in FIG. 9A. FIG. 9B is a graph showing a log-lin representation of the I-V characteristics for the exemplary tunnel junction of FIG. 9A. The junction was deposited by magnetic sputtering on a Si wafer covered with a 0.5 micron thick layer. The junction was comprised of layers of 50 Å Ti|150 Å Pd|160 Å IrMn(22/78)|24 Å CoFe(80/20)|18 Å Al plasma oxidized for 240 seconds |80 Å CoFe(80/20)|200 Å Pd. The non-linearity is striking. A ratio of I(V=xV)/I(V=0.5(x+0.2)V)=25 is almost a non-linearity ratio of 100. Further optimization can be accomplished by removing the $Al_2O_3$ and optimizing thickness and electrode materials for achieving the proper barrier height and proper non-linearity.

Writing of the cells can be performed using the vector sum of fields in a cross selection geometry or word and bit lines as described in U.S. Pat. No. 5,640,343 to Gallagher et al. Because of the intrinsic symmetrical I-V curves of the MBM, bi-directional writing can also be performed or assisted by a field generated from a current flowing through the MTJ-MBM combination. For writing through the MBM-MTJ combination with a current of, e.g., 1.5 mA, the voltage drop across the MTJ will be 0.35 V (see FIG. 4B), the voltage drop across the MBM will be 0.75 V. The voltage drop across the unselected MBMs will be 0.5(0.35+0.75)= 0.55V, resulting in a current of 70 $\mu A$ through every unselected cell. With n−1 unselected cells and n=100, the total sneak current will be 7 mA. Although this is larger than the 1.5 mA through the single selected cell, it is not a severe limitation because the current per individual unselected cell is n times smaller than that of the selected cell, so no undesired switching will take place.

An improvement of the writing selection will take place if the MTJ also shows a non-linear characteristic. The voltage drop will decrease at high write current and, hence, the difference between the selected and unselected write current will become larger.

Of course, there are variations and modifications that can be implemented in the present invention. For example, the bit lines can be located below the memory cells and connected to the memory cell non-linear elements, while the word lines are located above the memory cells and connected to the MTJs. The bit value stored by the MTJ can be detected by applying a constant voltage bias and measuring the current. Alternatively, the state of a memory cell can be sensed by forcing a predetermined fixed current through the selected memory cell and detecting the voltage on the bit line, with a fixed voltage applied on the word line. This alternative approach, however, provides less efficient sensing than the sensing techniques described above.

While the present invention has been described in connection with the illustrated embodiments, it will be appreciated and understood that modifications may be made without departing from the true spirit and scope of the invention.

What is claimed is:

1. A non-volatile memory cell, comprising:
   a non-linear selection element having a non-linear I-V characteristic, the non-linear selection element having at least a first metallic electrode layer, a barrier layer and a second metallic electrode layer metal, the non-linear selection element having a non-linearity defined by a current having a first magnitude flowing through the non-linear selection element for a first bias voltage across the non-linear selection element that is ten times or more smaller than a current having a second magnitude flowing through the non-linear selection element for a second bias voltage across the non-linear selection element, the second bias voltage being about two times greater than the first bias voltage; and
   a magnetic tunnel junction storage element connected in series with the non-linear tunnel selection element, the magnetic tunnel junction storage element having at least a first ferromagnetic layer, a thin insulating layer and a second ferromagnetic layer.

2. The non-volatile memory cell according to claim 1, wherein the first bias voltage is about 0.5 Volts and the second bias voltage is about 1.0 Volt.

3. The nonvolatile memory cell according to claim 1, wherein the barrier layer of the non-linear selection element is an insulating layer.

4. The nonvolatile memory cell according to claim 1, wherein the barrier layer of the non-linear selection element is a semi-conducting layer.

5. The nonvolatile memory cell according to claim 1, wherein the barrier layer is about 3 nm thick, and the barrier layer has a barrier height energy level of about 0.5 eV.

6. The nonvolatile memory cell according to claim 1, wherein one of the metallic electrode layers of the non-linear selection element and one of the ferromagnetic layers of the magnetic tunnel junction storage element are formed into a same layer and are common to both the non-linear selection element and the magnetic tunnel junction storage element.

7. The non-volatile memory cell according to claim 1, wherein the barrier layer of the non-linear selection device is an insulating material that, in combination with the metallic electrode layers, has a barrier height energy level of less than about 1 eV.

8. The non-volatile memory cell according to claim 7, wherein the barrier layer of the non-linear selection element is an insulating material formed from aluminum arsenide.

9. The non-volatile memory cell according to claim 1, wherein the barrier layer of the non-linear selection device is a semiconducting material that, in combination with the metallic electrode layers, has a barrier height energy level of less than about 1 eV.

10. The non-volatile memory cell according to claim 9, wherein the barrier layer of the non-linear selection device is a semiconducting material formed from one of silicon, germanium, boron-nitride, strontium titanate, diamond-like carbon, titanium dioxide, tin oxide, zinc oxide and an oxidic semiconductor.

11. The non-volatile memory cell according to claim 1, in which part of a write current for the non-volatile memory cell is sent through the non-volatile memory cell.

12. A non-volatile memory array, comprising:
    a substrate;
    a first plurality of electrically conductive traces formed on the substrate;
    a second plurality of electrically conductive traces formed on the substrate and overlapping first plurality of traces at a plurality of intersection regions; and
    a plurality of memory cells, each memory cell being located at an intersection region between one of the first plurality of traces and one of the second plurality of traces, at least one memory cell including a non-linear selection element in series with a magnetic tunnel junction storage element, the non-linear selection element having a non-linear I-V characteristic, the non-linear selection element having at least a first metallic electrode layer, a barrier layer and a second metallic electrode layer metal, the non-linear selection element having a non-linearity defined by a current having a first magnitude flowing through the non-linear selection element for a first bias voltage across the non-linear selection element that is ten times or more smaller than a current having a second magnitude flowing through the non-linear selection element for a second bias voltage across the non-linear selection element, such that the second bias voltage is about two times greater than the first bias voltage, and the magnetic tunnel junction storage element having at least a first ferromagnetic layer, a thin insulating layer and a second ferromagnetic layer.

13. The non-volatile memory array according to claim 12, wherein the first bias voltage is about 0.5 Volts and the second bias voltage is about 1.0 Volt.

14. The non-volatile memory array according to claim 12, wherein the barrier layer of the non-linear selection element is an insulating layer.

15. The non-volatile memory array according to claim 12, wherein the barrier layer of the non-linear selection element is a semi-conducting layer.

16. The non-volatile memory array according to claim 12, wherein the barrier layer is about 3 nm thick, and the barrier layer has a barrier height energy level of about 0.5 eV.

17. The non-volatile memory array according to claim 12, wherein one of the metallic electrode layers of the non-linear selection element and one of the ferromagnetic layers of the magnetic tunnel junction storage element are formed into a same layer and are common to both the non-linear selection element and the magnetic tunnel junction storage element.

18. The non-volatile memory array according to claim 12, wherein the barrier layer of the non-linear selection device is an insulating material that, in combination with the metallic electrode layers, has a barrier height energy level of less than about 1 eV.

19. The non-volatile memory array according to claim 14, wherein the barrier layer of the non-linear selection element is an insulating material formed from aluminum arsenide.

20. The non-volatile memory array according to claim 12, wherein the barrier layer of the non-linear selection device is a semiconducting material that, in combination with the metallic electrode layers, has a barrier height energy level of less than about 1 eV.

21. The non-volatile memory array according to claim 20, wherein the barrier layer of the non-linear selection device is a semiconducting material formed from one of silicon, germanium, boron-nitride, strontium titanate, diamond-like carbon, titanium dioxide, tin oxide, zinc oxide and an oxidic semiconductor.

22. The non-volatile memory array according to claim 12, in which part of a write current for the non-volatile memory cell is sent through the non-volatile memory cell.

* * * * *